(12) United States Patent
Zeng et al.

(10) Patent No.: US 11,626,512 B2
(45) Date of Patent: Apr. 11, 2023

(54) ELECTROSTATIC DISCHARGE PROTECTION DEVICES AND METHODS FOR FABRICATING ELECTROSTATIC DISCHARGE PROTECTION DEVICES

(71) Applicant: GLOBALFOUNDRIES Singapore Pte. Ltd., Singapore (SG)

(72) Inventors: Jie Zeng, Singapore (SG); Milova Paul, Singapore (SG); Sagar Premnath Karalkar, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 34 days.

(21) Appl. No.: 17/149,766

(22) Filed: Jan. 15, 2021

(65) Prior Publication Data
US 2022/0231151 A1    Jul. 21, 2022

(51) Int. Cl.
*H01L 29/06* (2006.01)
*H01L 29/66* (2006.01)
(Continued)

(52) U.S. Cl.
CPC ........ *H01L 29/747* (2013.01); *H01L 29/0623* (2013.01); *H01L 29/66386* (2013.01); *H01L 29/66393* (2013.01); *H01L 29/7436* (2013.01)

(58) Field of Classification Search
CPC ............... H01L 29/747; H01L 29/0623; H01L 29/66386; H01L 29/66393; H01L 29/7436;
(Continued)

(56) References Cited

U.S. PATENT DOCUMENTS 6,258,634 B1   7/2001 Wang et al.
6,784,029 B1   8/2004 Vashchenko et al.
(Continued)

OTHER PUBLICATIONS

Zhan et al., "High-voltage Asymmetrical Bi-directional Device for System-level ESD Protection of Automotive Applications on a BiCMOS Technology", 2013 35th Electrical Overstress/Electrostatic Discharge Symposium, 2013, 8 pages, IEEE.
(Continued)

*Primary Examiner* — Natalia A Gondarenko
(74) *Attorney, Agent, or Firm* — Viering Jentschura & Partner mbB

(57) ABSTRACT

An ESD protection device may include a substrate having first and second substrate layers, and first and second bridged regions. Each substrate layer may include first and second border regions and a middle region laterally therebetween. Each bridged region may be arranged within the middle region and a respective border region of the second substrate layer. The middle region of the second substrate layer may be laterally narrower than the middle region of the first substrate layer. Each border region of the second substrate layer may be partially arranged over the middle region of the first substrate layer and partially arranged over a respective border region of the first substrate layer. The border regions of the substrate layers, and the bridged regions may have a first conductivity type, and the middle regions of the substrate layers may have a second conductivity type different from the first conductivity type.

19 Claims, 5 Drawing Sheets

(51) Int. Cl.
*H01L 29/74* (2006.01)
*H01L 29/747* (2006.01)

(58) Field of Classification Search
CPC ............ H01L 29/7801; H01L 29/7816–7826;
H01L 29/7833; H01L 29/0696; H01L
29/66674; H01L 29/66681–66704; H01L
29/1095; H01L 2924/1306; H01L
2924/13091; H01L 2924/1305; H01L
2924/13055; H01L 2924/13062; H01L
27/0259; H01L 27/0262; H01L 27/0266;
H01L 27/0623; H01L 27/098; H01L
27/0617; H01L 29/808; H01L 29/0692;
H01L 29/0634; H01L 29/7835; H01L
29/66901; H01L 29/1066; H01L 29/78;
H01L 29/7811; H01L 29/0619; H01L
29/0649; H01L 29/0653; H01L 29/7832;
H01L 29/0847; H01L 29/66659; H01L
29/7838; H01L 29/0843; H01L 29/7809;
H01L 29/0882; H01L 29/1083; H01L
29/41758; H01L 29/42316; H01L
29/6606; H01L 29/66893; H01L
29/66568; H01L 29/70; H01L 29/7424;
H01L 29/0615; H01L 29/0661; H01L
29/0865; H01L 29/0886; H01L 29/41725;
H01L 29/4238; H01L 29/0834; H01L
29/73
USPC ....... 257/162, 173, 119, 360, 133, 285, 341,
257/355, 343, 344, 379
See application file for complete search history.

(56) References Cited

U.S. PATENT DOCUMENTS

| | | | |
|---|---|---|---|
| 6,960,792 B1 | 11/2005 | Nguyen | |
| 7,196,361 B1 | 3/2007 | Vashchenko et al. | |
| 7,786,507 B2 | 8/2010 | Denison et al. | |
| 7,915,638 B2 | 3/2011 | Tseng et al. | |
| 8,553,380 B2 | 10/2013 | Salcedo | |
| 8,633,509 B2 | 1/2014 | Salcedo et al. | |
| 9,018,072 B2 | 4/2015 | Gendron et al. | |
| 9,318,481 B1 | 4/2016 | Wang et al. | |
| 2009/0039385 A1* | 2/2009 | Liu | H01L 29/7436 257/E29.189 |
| 2013/0328103 A1* | 12/2013 | Salcedo | H01L 27/0262 257/121 |
| 2014/0225228 A1* | 8/2014 | Salcedo | H01L 27/0262 257/575 |

OTHER PUBLICATIONS

Zhan et al., "High-Performance Bi-directional SCR Developed on a 0.13um SOI-based Smart Power Technology for Automotive Applications", 2017 39th Electrical Overstress/Electrostatic Discharge Symposium (EOS/ESD), 2017, 7 pages, IEEE.

Vashchenko et al., "Multi-Port ESD Protection Using Bi-Directional SCR Structures", 2003 Proceedings of the Bipolar/BiCMOS Circuits and Technology Meeting, 2003, pp. 137-140, IEEE.

Vashchenko et al., "Implementation of 60V Tolerant Dual Direction ESD Protection in 5V BiCMOS Process for Automotive Application", 2004 Electrical Overstress/Electrostatic Discharge Symposium, 2004, 8 pages, IEEE.

Vashchenko et al., "Implementation of Dual-Direction SCR Devices in Analog CMOS Process", 2007 29th Electrical Overstress/Electrostatic Discharge Symposium (EOS/ESD), 2007, 5 pages, IEEE.

Wang et al., "No-Snapback Silicon-Controlled Rectifier for Electrostatic Discharge Protection of High-Voltage ICs", IEEE Electron Device Letters, 2015, pp. 1121-1123, vol. 36, No. 11, IEEE.

* cited by examiner

ELECTROSTATIC DISCHARGE PROTECTION DEVICES AND METHODS FOR FABRICATING ELECTROSTATIC DISCHARGE PROTECTION DEVICES

TECHNICAL FIELD

The present disclosure relates generally to electrostatic discharge (ESD) protection devices and methods for fabricating the ESD protection devices.

BACKGROUND

ESD protection devices are often used to protect electrical apparatuses from being damaged by ESD events. One type of ESD protection device is the bi-directional silicon-controlled rectifier (SCR) device that typically includes an N-well arranged laterally between two P-wells. Each P-Well includes terminal regions arranged therein, and in use, the terminal regions of each P-Well are connected to a terminal of an apparatus to be protected. When an ESD event occurs in the apparatus (causing a voltage difference between the terminals of the apparatus to exceed a trigger voltage), the SCR device turns on and conducts current away from the apparatus. This hence protects the apparatus from being damaged by the ESD event.

However, a typical bi-directional SCR device often has deep snapback behaviour. For example, the SCR device usually has a low holding voltage and a high trigger voltage. The low holding voltage of the SCR device tends to increase the possibility of latch-up in the device. A current solution to increase the holding voltage of the SCR device is to increase a length of the N-well between the P-wells. However, this not only increases the size of the SCR device, but also largely increases the on-resistance and degrade the failure current of the SCR device.

SUMMARY

According to various non-limiting embodiments, there may be provided an electrostatic discharge (ESD) protection device including: a substrate including a first substrate layer and a second substrate layer over the first substrate layer, where each substrate layer may include a first border region, a second border region and a middle region laterally therebetween; and a first bridged region and a second bridged region, where each bridged region may be arranged within the middle region and a respective border region of the second substrate layer; where the middle region of the second substrate layer may be laterally narrower than the middle region of the first substrate layer; where each border region of the second substrate layer may be partially arranged over the middle region of the first substrate layer and partially arranged over a respective border region of the first substrate layer; and where the border regions of the substrate layers and the bridged regions may have a first conductivity type, and where the middle regions of the substrate layers may have a second conductivity type different from the first conductivity type.

According to various non-limiting embodiments, there may be provided a method for fabricating an electrostatic discharge (ESD) protection device. The method may include: providing a substrate; forming a first substrate layer and a second substrate layer over the first substrate layer, where each substrate layer may include a first border region, a second border region and a middle region laterally therebetween; and forming a first bridged region and a second bridged region, where each bridged region may be arranged within the middle region and a respective border region of the second substrate layer; where the middle region of the second substrate layer may be laterally narrower than the middle region of the first substrate layer; where each border region of the second substrate layer may be partially arranged over the middle region of the first substrate layer and partially arranged over a respective border region of the first substrate layer; and where the border regions of the substrate layers and the bridged regions may have a first conductivity type, and where the middle regions of the substrate layers may have a second conductivity type different from the first conductivity type.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Non-limiting embodiments of the invention will now be illustrated for the sake of example only with reference to the following drawings, in which.

DETAILED DESCRIPTION

Figure 1A:
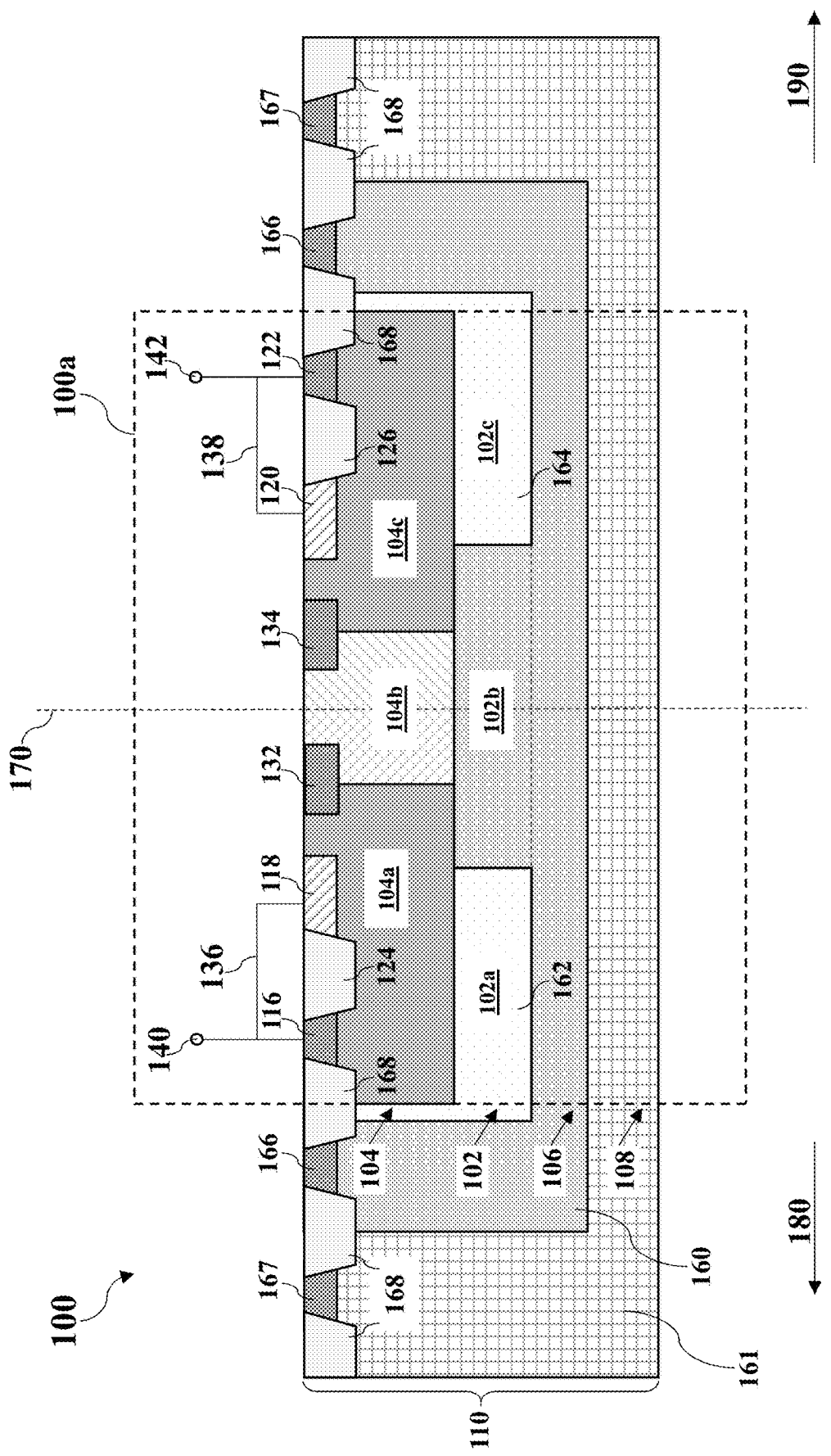
FIG. 1A shows a simplified cross-sectional view of an ESD protection device according to various non-limiting embodiments.

The embodiments generally relate to semiconductor devices. More particularly, some embodiments relate to ESD protection devices. The ESD protection devices may, for example, be incorporated into integrated circuits (ICs). The devices or ICs may be used with apparatuses such as, but not limited to, consumer electronic products.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "approximately", "about," is not limited to the precise value specified. In some instances, the approximating language may correspond to the precision of an instrument for measuring the value. Further, a direction is modified by a term or terms, such as "substantially" to mean that the direction is to be applied within normal tolerances of the semiconductor industry. For example, "substantially parallel" means largely extending in the same direction within normal tolerances of the semiconductor industry and "substantially perpendicular" means at an angle of ninety degrees plus or minus a normal tolerance of the semiconductor industry.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Figure 1B:
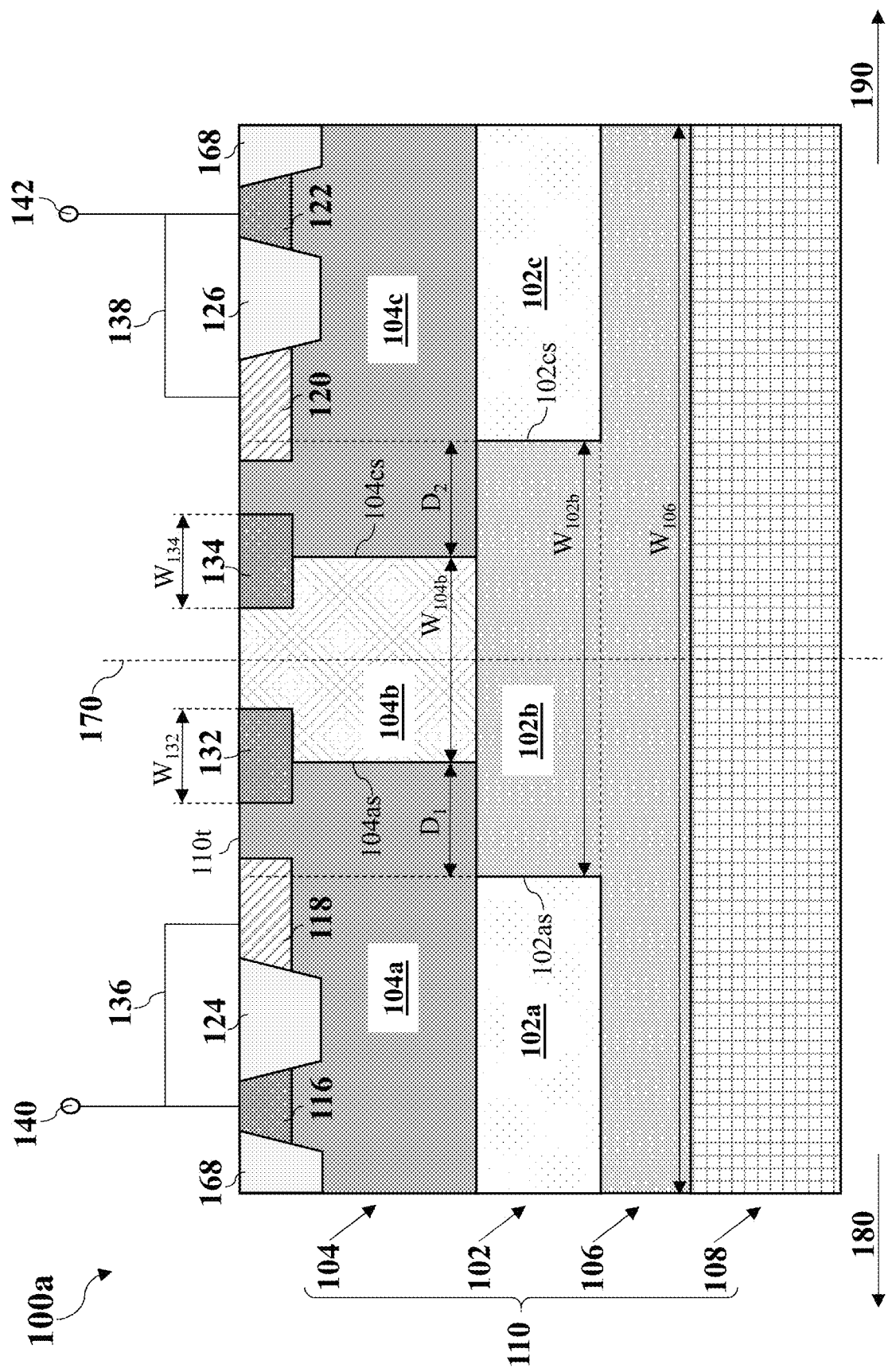
FIG. 1B shows a simplified cross-sectional view of a portion of the ESD protection device of FIG. 1A.

FIG. 1A shows a simplified cross-sectional view of an ESD protection device 100 according to various non-limiting embodiments, and FIG. 1B shows a simplified cross-sectional view of a portion 100a (through which discharge currents may flow when the device 100 is in operation) of the ESD protection device 100. The ESD protection device 100 may be a bi-directional silicon-controlled rectifier (SCR) device.

As shown in FIG. 1A, the ESD protection device 100 may include a substrate 110. The substrate 110 may include a semiconductor material, such as but not limited to, silicon (Si), germanium (Ge), silicon carbide (SiC), gallium arsenide (GaAs), gallium nitride (GaN), or combinations thereof. For example, the substrate 110 may include single crystal silicon. In some non-limiting embodiments, the substrate 110 may include a semiconductor-on-insulator substrate, such as but not limited to a silicon-on-insulator (SOI), a germanium-on-insulator (GeOI) substrate, a SiC-on-insulator (SiCOI) substrate, a GaAs-on-insulator (GaAsOI) substrate, a GaN-on-insulator (GaNOI) substrate, or combinations thereof. As shown in FIG. 1A, the ESD protection device 100 may be symmetrical about a vertical axis 170 extending through a center of the substrate 110.

As shown in FIGS. 1A and 1B, the substrate 110 may include a first substrate layer 102, a second substrate layer 104, a third substrate layer 106 and a fourth substrate layer 108. The second substrate layer 104 may be arranged over the first substrate layer 102, the third substrate layer 106 may be arranged under the first substrate layer 102 and the fourth substrate layer 108 may be arranged under the third substrate layer 106.

The first substrate layer 102 may include a first border region 102a, a second border region 102c and a middle region 102b laterally between the first border region 102a and the second border region 102c. Referring to FIG. 1B, the second border region 102c may include a side surface 102cs facing a first direction 180 and the first border region 102a may include a side surface 102as facing a second direction 190 opposite to the first direction 180. The side surface 102as of the first border region 102a and the side surface 102cs of the second border region 102c may contact the middle region 102b.

The second substrate layer 104 may include a first border region 104a, a second border region 104c and a middle region 104b laterally between the first border region 104a and the second border region 104c. The first border region 104a, the middle region 104b and the second border region 104c of the second substrate layer 104 may be arranged over the first border region 102a, the middle region 102b and the second border region 102c of the first substrate layer 102 respectively. As shown in FIG. 1B, the middle region 104b of the second substrate layer 104 may be laterally narrower than the middle region 102b of the first substrate layer 102. For example, a width $W_{104b}$ of the middle region 104b of the second substrate layer 104 may range from about 30% to about 70% of a width $W_{102b}$ of the middle region 102b of the first substrate layer 102. Accordingly, as shown in FIG. 1B, each border region 104a, 104c of the second substrate layer 104 may be partially arranged over the middle region 102b of the first substrate layer 102 and partially arranged over a respective border region 102a, 102c of the first substrate layer 102. The first border region 104a and the second border region 104c may respectively include side surfaces 104as, 104cs facing opposite directions 180, 190. These side surfaces 104as, 104cs may be in contact with the middle region 104b of the second substrate layer 104.

As shown in FIG. 1B, the first border region 104a of the second substrate layer 104 may extend laterally beyond the side surface 102as of the first border region 102a of the first substrate layer 102. Similarly, the second border region 104c of the second substrate layer 104 may extend laterally beyond the side surface 102cs of the second border region 102c of the first substrate layer 102. Accordingly, the first border region 102a and the second border region 102c of the first substrate layer 102 may each be referred to as a pulled-back region, and the junction between each of the border regions 102a, 102c and the middle region 102b of the first substrate layer 102 may be referred to as a pulled-back junction. A lateral distance $D_1$ between the side surfaces 102as, 104as of the first border regions 102a, 104a of the layers 102, 104 may be approximately equal to a lateral distance $D_2$ between the side surfaces 102cs, 104cs of the second border regions 102c, 104c of the layers 102, 104. In various non-limiting embodiments, the lateral distances $D_1$, $D_2$ may each range from about 2 um to about 10 um.

The third substrate layer 106 may be laterally wider than the middle region 102b of the first substrate layer 102. For example, a width $W_{106}$ of the third substrate layer 106 may range from about 130% to about 250% of a width $W_{102b}$ of the middle region 102b of the first substrate layer 102. As shown in FIG. 1B, each of the border regions 102a, 102c of the first substrate layer 102 may be arranged entirely over the third substrate layer 106. Accordingly, the third substrate layer 106 may electrically isolate the border regions 102a, 102c of the first substrate layer 102 from the fourth substrate layer 108 under the third substrate layer 106.

The first border region 104a of the second substrate layer 104 may further include a first terminal region 116 and a second terminal region 118. The second border region 104c of the second substrate layer 104 may further include a third terminal region 120 and a fourth terminal region 122. As shown in FIGS. 1A and 1B, the first, second, third and fourth terminal regions 116, 118, 120, 122 may be arranged along a top surface 110t of the substrate 110. The second terminal region 118 may be arranged over the side surface 102as of the first border region 102a of the first substrate layer 102. Similarly, the third terminal region 120 may be arranged over the side surface 102cs of the second border region 102c of the first substrate layer 102. In other words, the side surface 102as of the first border region 102a of the first substrate layer 102 may overlap vertically with the second terminal region 118, and the side surface 102cs of the second border region 102c of the first substrate layer 102 may overlap vertically with the third terminal region 120.

A first isolation element 124 may be arranged laterally between the first and second terminal regions 116, 118. Accordingly, the first and second terminal regions 116, 118 may be electrically isolated from each other along the top surface 110t of the substrate 110. Similarly, a second isolation element 126 may be arranged laterally between the third and fourth terminal regions 120, 122, and thus, the third and fourth terminal regions 120, 122 may be electrically isolated from each other along the top surface 110t of the substrate 110. Each isolation element 124, 126 may include an isolation/electrically insulating material, such as, but not limited to, dielectric material (e.g. silicon oxide). For example, each isolation element 124, 126 may be a shallow trench isolation (STI) element.

The ESD protection device 100 may further include a first bridged region 132 arranged within the middle region 104b and the first border region 104a of the second substrate layer 104, and a second bridged region 134 arranged within the middle region 104b and the second border region 104c of the second substrate layer 104. A percentage of a width $W_{132}$ of the first bridged region 132 within the middle region 104b and a percentage of a width $W_{134}$ of the second bridged region 134 within the middle region 104b may be adjusted to vary an on-resistance of the ESD protection device 100. The first and second bridged regions 132, 134 may be arranged along the top surface 110t of the substrate 110. Further, these bridged regions 132, 134 may be laterally spaced apart from each other, such that a portion of the middle region 104b of the second substrate layer 104 may be arranged laterally between them. As shown in FIG. 1B, the second terminal region 118 may be arranged laterally between the first terminal region 116 and the first bridged region 132. The second terminal region 118 may be spaced apart from the first bridged region 132, with a portion of the first border region 104a of the second substrate layer 104 arranged laterally between them. Similarly, the third terminal region 120 may be arranged laterally between the fourth terminal region 122 and the second bridged region 134. The third terminal region 120 may also be spaced apart from the second bridged region 134, with a portion of the second border region 104c of the second substrate layer 104 arranged laterally between them.

As shown in FIG. 1B, the ESD protection device 100 may further include a first conductive line 136 and a second conductive line 138 arranged over the substrate 110. The first conductive line 136 may connect the first and second terminal regions 116, 118; whereas, the second conductive line 138 may connect the third and fourth terminal regions 120, 122. Accordingly, the first and second terminal regions 116, 118 may be electrically connected to each other, and the third and fourth terminal regions 120, 122 may be electrically connected to each other. The first conductive line 136 may be further connected to a first conductive pad 140 and the second conductive line 138 may be further connected to a second conductive pad 142. The first conductive line 136, the second conductive line 138, the first conductive pad 140 and the second conductive pad 142 may include electrically conductive material, such as, but not limited to metal.

In various non-limiting embodiments, each substrate layer 102, 104, 106, 108, the first to fourth terminal regions 116-122 and the bridged regions 132, 134 may include dopants. The border regions 102a, 102c of the first substrate layer 102, the border regions 104a, 104c of the second substrate layer 104, the entire fourth substrate layer 108, the first terminal region 116, the fourth terminal region 122, the first bridged region 132 and the second bridged region 134 may have a first conductivity type (in other words, may include dopants of the first conductivity type). On the other hand, the middle region 102b of the first substrate layer 102, the middle region 104b of the second substrate layer 104, the entire third substrate layer 106, the second terminal region 118 and the third terminal region 120 may have a second conductivity type different from the first conductivity type (in other words, may include dopants of the second conductivity type). In various non-limiting embodiments, the first conductivity type may be P-type and the second conductivity type may be N-type. However, the first conductivity type may alternatively be N-type and the second conductivity type may alternatively be P-type. The P-type dopants may include boron (B), aluminum (Al), indium (In), or combinations thereof; whereas, the N-type dopants may include phosphorous (P), arsenic (As), antimony (Sb), or combinations thereof.

Doping concentrations (number of dopants per unit volume) of the third substrate layer 106, and the first border region 102a, the middle region 102b and the second border region 102c of the first substrate layer 102 may be approximately equal, and doping concentrations of the first border region 104a, the middle region 104b and the second border region 104c of the second substrate layer 104 may be approximately equal. The doping concentration of the first border region 102a of the first substrate layer 102 may be less than the doping concentration of the first border region 104a of the second substrate layer 104; the doping concentration of the second border region 102c of the first substrate layer 102 may be less than the doping concentration of the second border region 104c of the second substrate layer 104; and the doping concentration of the middle region 102b of the first substrate layer 102 may be less than the doping concentration of the middle region 104b of the second substrate layer 104. For example, the doping concentration of the third substrate layer 106, and each of the first border region 102a, the middle region 102b and the second border region 102c of the first substrate layer 102 may range from about 1E15 cm$^{-3}$ to about 5E16 cm$^{-3}$; whereas, the doping concentration of each of the first border region 104a, the middle region 104b and the second border region 104c of the second substrate layer 104 may range from about 1E17 cm$^{-3}$ to about 5E18 cm$^{-3}$. The doping concentration of the third substrate layer 106 may be greater than the doping concentration of the fourth substrate layer 108. For example, the doping concentration of the fourth substrate layer 108 may range from about 1E15 cm$^{-3}$ to about 1E16 cm$^{-3}$.

Further, doping concentrations of the first terminal region 116, the second terminal region 118, the third terminal region 120, the fourth terminal region 122, the first bridged region 132 and the second bridged region 134 may be approximately equal. The doping concentration of the first bridged region 132 may be greater than the doping concentration of the first border region 104a of the second substrate layer 104. Similarly, the doping concentration of the second bridged region 134 may be greater than the doping concentration of the second border region 104c of the second substrate layer 104. Further, the doping concentration of each of the first terminal region 116 and the second terminal region 118 may be greater than the doping concentration of the first border region 104a of the second substrate layer 104; and the doping concentration of each of the third terminal region 120 and the fourth terminal region 122 may be greater than the doping concentration of the second border region 104c of the second substrate layer 104. For example, the doping concentration of each of the first terminal region 116, the second terminal region 118, the third terminal region 120, the fourth terminal region 122, the first bridged region 132 and the second bridged region 134 may range from about 5E19 cm$^{-3}$ to about 5E20 cm$^{-3}$.

In various non-limiting embodiments, each border region 102a, 102c and the middle region 102b of the first substrate layer 102 may include at least a part of a high voltage well. For example, referring to FIG. 1A, the entire third substrate layer 106, together with the middle region 102b of the first substrate layer 102, may be a part of a first high voltage well 160. In addition, the first border region 102a of the first substrate layer 102 may be a part of a second high voltage well 162, and the second border region 102c of the first substrate layer 102 may be a part of a third high voltage well 164. Further, each border region 104a, 104c and the middle region 104b of the second substrate layer 104 may be a well, and the fourth substrate layer 108 may be a part of a portion 161 of the substrate 110.

In an exemplary non-limiting embodiment, the first border region 102a and the second border region 102c of the first substrate layer 102 may be parts of high voltage P-wells (HVPW) 162, 164; the entire third substrate layer 106, together with the middle region 102b of the first substrate layer 102, may be a part of a high-voltage N-well (HVNW) 160, the first border region 104a and the second border region 104c of the second substrate layer 104 may be P-wells (PW) and the middle region 104b of the second substrate layer 104 may be an N-well (NW). The first terminal region 116, the fourth terminal region 122 and the bridged regions 132, 134 may be P+ regions, and the second terminal region 118 and the third terminal region 120 may be N+ regions, where the sign "+" indicates a higher doping concentration. Further, the substrate 110 may be a P-type substrate.

Referring to FIG. 1A, further terminal regions 166, 167 and further isolation elements 168 may be arranged within the substrate 110. The terminal regions 166 may be arranged within the first high voltage well 160 and may have a same conductivity type as the first high voltage well 160; whereas the terminal regions 167 may be arranged within the portion 161 of the substrate 110 and may have a same conductivity type as this portion 161. The terminal regions 166, together with a part of the first high voltage well 160, may serve as a first guard ring. The terminal regions 167, together with the portion 161 of the substrate 110 may serve as a second guard ring. For example, the first guard ring may be a high voltage N-well (HVNWELL) guard ring; and the second guard ring may be a P-type substrate (P-Sub) guard ring. These guard rings may isolate the portion 100a from adjacent devices on a wafer and therefore, multiple ESD protection devices 100 may be formed simultaneously on a wafer.

Figure 2:
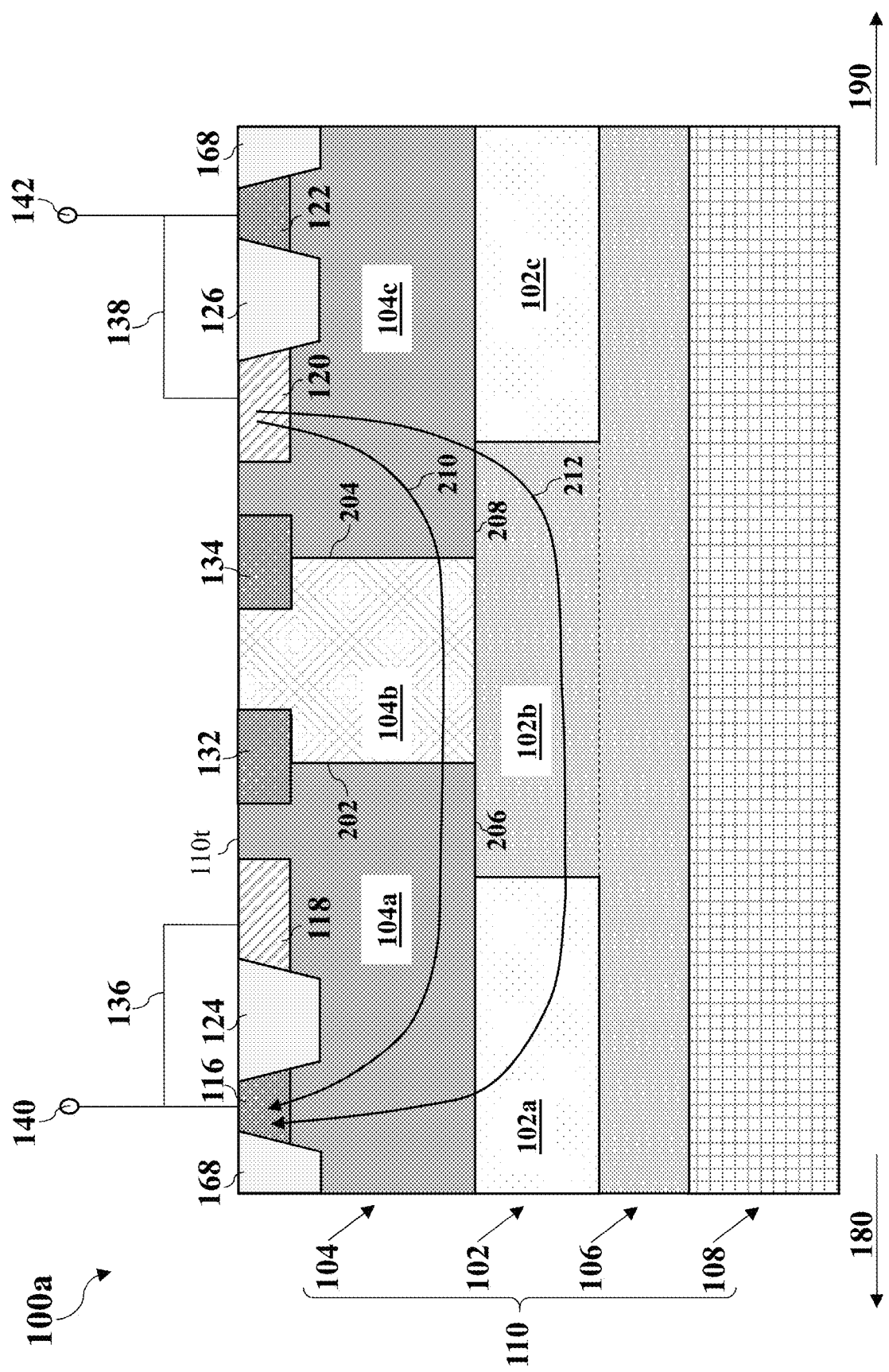
FIG. 2 shows the ESD protection device of FIGS. 1A and 1B in operation according to various non-limiting embodiments.

FIG. 2 shows the portion 100a of the ESD protection device 100 when the device 100 is in operation according to various non-limiting embodiments, where the first conductivity type may be P-type and the second conductivity type may be N-type. For clarity of illustration, some reference numerals are omitted from FIG. 2.

Due to the conductivity types of the regions 102a-102c, 104a-104c, the junction 202 between the first border region 104a and the middle region 104b of the second substrate layer 104, the junction 204 between the second border region 104c and the middle region 104b of the second substrate layer 104, the junction 206 between the first border region 104a of the second substrate layer 104 and the middle region 102b of the first substrate layer 102, and the junction 208 between the second border region 104c of the second substrate layer 104 and the middle region 102b of the first substrate layer 102 may be P-N junctions. In operation, the first conductive pad 140 may be connected to a first terminal of an apparatus to be protected and the second conductive pad 142 may be connected to a second terminal of the apparatus. When a first voltage $V_{T1}$ at the first terminal is greater than a second voltage $V_{T2}$ at the second terminal, the P-N junctions 204, 208 may be reversed biased and the P-N junctions 202, 206 may be forward biased. During an ESD event, a voltage difference $V_{T1}$-$V_{T2}$ between the first and second voltages $V_{T1}$, $V_{T2}$ may exceed a trigger voltage, causing the reverse biased P-N junctions 204, 208 to break down. As shown in FIG. 2, a first discharge current 210 may thus flow from the second terminal of the apparatus through the third terminal region 120, the second border region 104c of the second substrate layer 104, the middle region 104b of the second substrate layer 104 and the first border region 104a of the second substrate layer 104 in this order, and may then be collected at the first terminal region 116. A second discharge current 212 may also flow from the second terminal of the apparatus through the third terminal region 120, the second border region 104c of the second substrate layer 104, the middle region 102b of the first substrate layer 102, the first border region 102a of the first substrate layer 102 and the first border region 104a of the second substrate layer 104 in this order, and may then be collected at the first terminal region 116. The first border region 102a of the first substrate layer 102 may also help to collect the second discharge current 212. The first and second discharge currents 210, 212 may occur almost simultaneously and hence, excess current may be conducted away from the apparatus. The apparatus may thus be protected against damage from the ESD event.

When the second voltage $V_{T2}$ at the second terminal is greater than the first voltage $V_{T1}$ at the first terminal, and a voltage difference $V_{T2}$-$V_{T1}$ between these terminals exceed the trigger voltage of the ESD protection device 100, first and second discharge currents similar to the above-mentioned discharge currents 210, 212 may also flow through the ESD protection device 100 in a similar manner, except that the directions of these currents may be opposite to that described above. It would be clear to a person skilled in the art that the directions of the first and second discharge currents 210, 212 will change accordingly when the first conductivity type and the second conductivity type are instead the N-type and the P-type respectively.

By including the pulled-back regions (border regions 102a, 102c of the first substrate layer 102), the second discharge current 212 may more easily pass through the middle region 102b of the first substrate layer 102. For example, by arranging the side surface 102cs of the second border region 102c of the first substrate layer 102 under the third terminal region 120, a distance between the third terminal region 120 and the middle region 102b of the first substrate layer 102 may be reduced and thus, the current path for the second discharge current 212 may be shorter. In addition, including the more highly doped bridged regions 132, 134 may allow the trigger voltage of the ESD protection device 100 to be within a reasonable range. These bridged regions 132, 134 may also help block current from flowing to the surface 110t of the substrate 110 and thus, the current may be directed towards the bottom of the substrate 110. Accordingly, a current density of the ESD protection device 100 may be higher and the current path through the device 100 may be deeper. The ESD protection device 100 may thus have a higher current conduction capability and a lower on-resistance. Further, the peak electric field along the P-N junctions (e.g. junctions 202, 204, 206, 208) within the ESD protection device 100 may be lower in operation as compared to prior art devices and hence, the lattice temperature of the ESD protection device 100 may increase more slowly. In turn, the ESD protection device 100 may have a higher holding voltage and a higher failure current. In an exemplary non-limiting embodiment, the ESD protection device 100 may have a failure current ranging from about 20 mA/μm to about 100 mA/μm and an on-resistance ranging from about 200Ω/μm to about 500Ω/μm. In a non-limiting example, the failure current of the ESD protection device 100 may be about 31 mA/μm and the on-resistance of the ESD protection device 100 may be about 0.38KΩ/μm.

Figure 3:
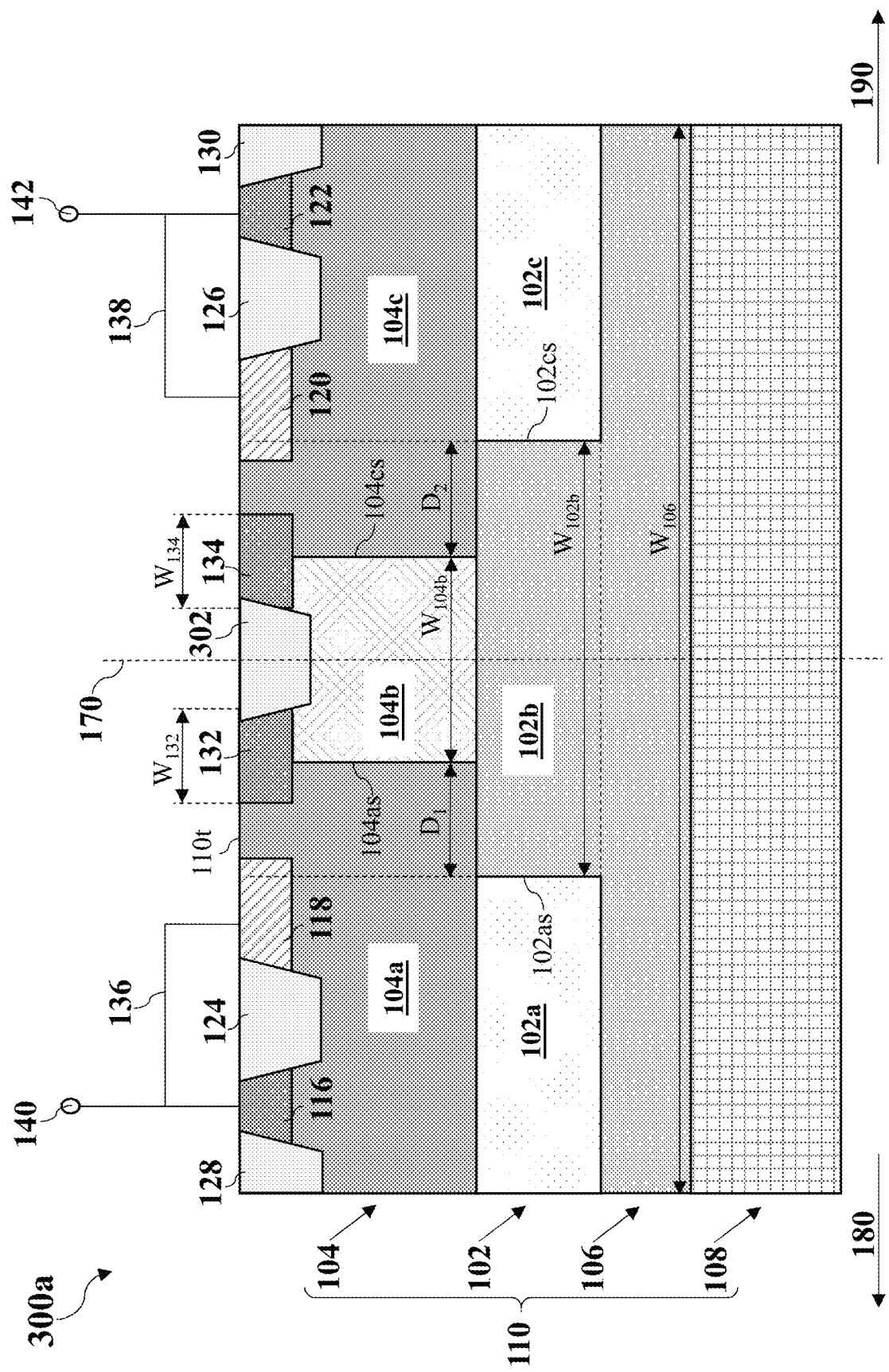
FIG. 3 shows a simplified cross-sectional view of a portion of an ESD protection device according to alternative non-limiting embodiments.

FIG. 3 shows a cross-sectional view of a portion 300a of an alternative ESD protection device according to various non-limiting embodiments. The alternative ESD protection device is similar to the ESD protection device 100 and hence, the common features are labelled with the same reference numerals and need not be discussed.

As shown in FIG. 3, the portion 300a of the alternative ESD protection device may further include an isolation element 302 arranged laterally between the first bridged region 132 and the second bridged region 134. The isolation element 302 may electrically isolate the first bridged region 132 and the second bridged region 134 along the top surface 110t of the substrate 110. The isolation element 302 may help to further block the current from flowing to the surface 110t of the substrate 110 and hence, the current may be further directed towards the bottom of the substrate 110.

Figure 4:
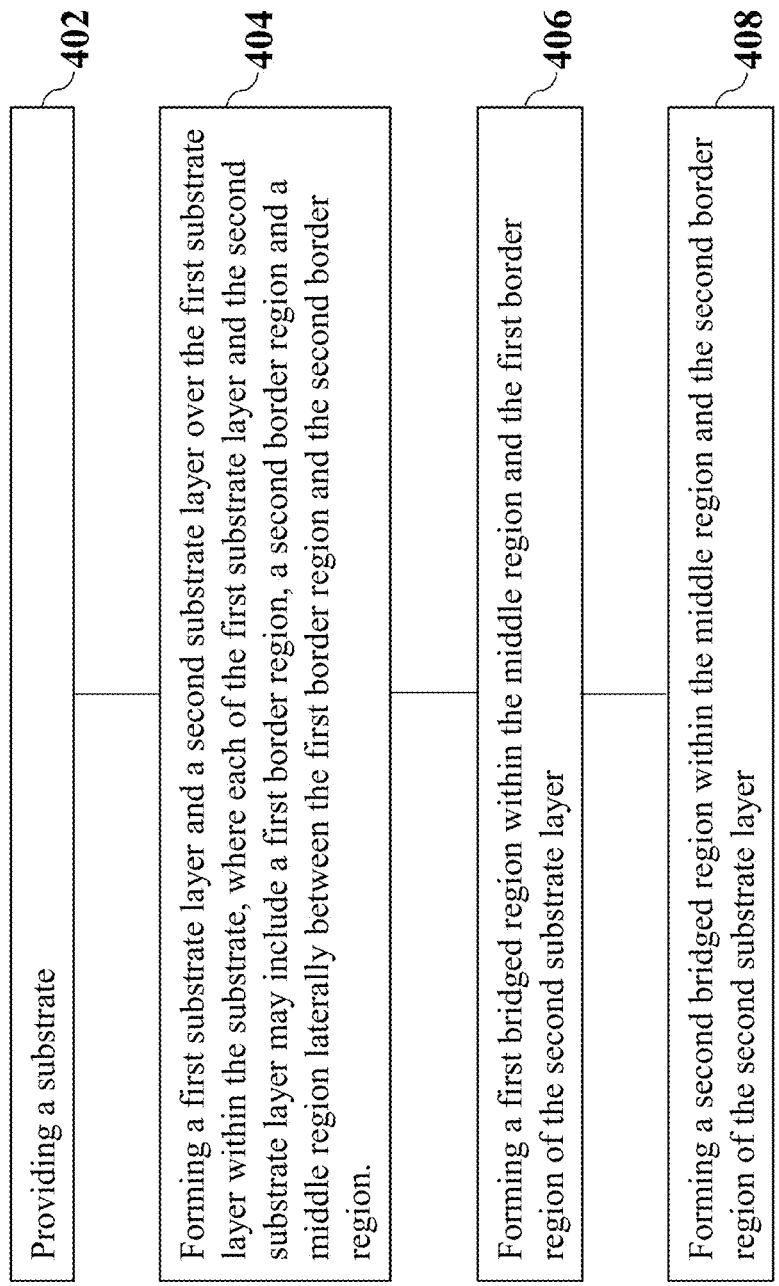
FIG. 4 shows a flow diagram of a method for fabricating an ESD protection device according to various non-limiting embodiments.

FIG. 4 shows a flow diagram of a method for fabricating an ESD protection device according to various non-limiting embodiments.

At 402, the method may include providing a substrate. The substrate may for example, be the substrate 110 described above.

At 404, the method may include forming a first substrate layer and a second substrate layer over the first substrate layer within the substrate, where each of the first substrate layer and the second substrate layer may include a first border region, a second border region and a middle region laterally between the first border region and the second border region. The first substrate layer may for example, be the first substrate layer 102 described above, and the first border region, the second border region and the middle region of the first substrate layer may for example, be the first border region 102a, the second border region 102c and the middle region 102b described above. The second substrate layer may for example, be the second substrate layer 104 described above, and the first border region, the second border region and the middle region of the second substrate layer may for example, be the first border region 104a, the second border region 104c and the middle region 104b described above. 404 may include any process as known to those skilled in the art. For example, 404 may include doping a particular portion of the substrate 110 with appropriate dopants to form each region 102a-102c, 104a-104c.

At 406, the method may include forming a first bridged region within the middle region and the first border region of the second substrate layer. The first bridged region may for example, be the first bridged region 132 described above. 406 may include any process as known to those skilled in the art. For example, 406 may include doping a particular portion of the substrate 110 with appropriate dopants to form the first bridged region 132.

At 408, the method may include forming a second bridged region within the middle region and the second border region of the second substrate layer. The second bridged region may for example, be the second bridged region 134 described above. 408 may include any process as known to those skilled in the art. For example, 408 may include doping a particular portion of the substrate 110 with appropriate dopants to form the second bridged region 134.

The above described order for the method is only intended to be illustrative, and the method is not limited to the above specifically described order unless otherwise specifically stated. The method may further include doping particular portions of the substrate (e.g. substrate 110) to form terminal regions (e.g. terminal regions 116, 118, 120, 122, 166, 167) and additional substrate layers (e.g. third and fourth substrate layers 106, 108) within the substrate 110. In addition, the method may include removing portions of the substrate (e.g. substrate 110) to form openings/trenches and filling these openings/trenches with isolation material to form isolation elements (e.g. isolation elements 124, 126, 168). The method may also include forming conductive lines and conductive pads (e.g. conductive lines 136, 138 and conductive pads 140, 142) using for example, a back-end-of-line (BEOL) process.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. An electrostatic discharge (ESD) protection device comprising:
   a substrate comprising a first substrate layer and a second substrate layer over the first substrate layer, wherein each substrate layer comprises a first border region, a second border region and a middle region extending continuously and laterally from the first border region to the second border region; and a first bridged region and a second bridged region, wherein each bridged region is continuous and arranged within the middle region and a respective border region of the second substrate layer;

wherein the middle region of the second substrate layer is laterally narrower than the middle region of the first substrate layer, wherein a width of the middle region of the second substrate layer ranges from about 30% to about 70% of a width of the middle region of the first substrate layer;

wherein each border region of the second substrate layer is arranged over and partially overlapping the middle region of the first substrate layer and arranged over and overlapping a respective border region of the first substrate layer; and wherein the first and second border regions of the first and second substrate layers and the first and second bridged regions have a first conductivity type, and wherein the middle regions of the first and second substrate layers have a second conductivity type different from the first conductivity type, wherein the first and second border regions of each substrate layer include a continuous region of the first conductivity type laterally extending between opposite border edges.

2. The ESD protection device of claim 1, wherein a doping concentration of the first border region of the first substrate layer is less than a doping concentration of the first border region of the second substrate layer;

wherein a doping concentration of the second border region of the first substrate layer is less than a doping concentration of the second border region of the second substrate layer; and wherein a doping concentration of the middle region of the first substrate layer is less than a doping concentration of the middle region of the second substrate layer.

3. The ESD protection device of claim 1, wherein a doping concentration of the first bridged region is greater than a doping concentration of the first border region of the second substrate layer; and wherein a doping concentration of the second bridged region is greater than a doping concentration of the second border region of the second substrate layer.

4. The ESD protection device of claim 1, wherein the first border region of the second substrate layer further comprises a first terminal region and a second terminal region, wherein the first terminal region has the first conductivity type; wherein the second terminal region has the second conductivity type; and wherein the second terminal region is arranged laterally between the first terminal region and the first bridged region.

5. The ESD protection device of claim 4, wherein a doping concentration of each of the first terminal region and the second terminal region is greater than a doping concentration of the first border region of the second substrate layer.

6. The ESD protection device of claim 4, wherein the second terminal region is arranged over a side surface of the first border region of the first substrate layer and a side surface of the middle region of the first substrate layer.

7. The ESD protection device of claim 4, wherein the second border region of the second substrate layer further comprises a third terminal region and a fourth terminal region, wherein the third terminal region has the second conductivity type; wherein the fourth terminal region has the first conductivity type; and wherein the third terminal region is arranged laterally between the fourth terminal region and the second bridged region.

8. The ESD protection device of claim 7, wherein a doping concentration of each of the third terminal region and the fourth terminal region is greater than a doping concentration of the second border region of the second substrate layer.

9. The ESD protection device of claim 8, wherein the second border region of the second substrate layer extends laterally beyond a side surface of the second border region of the first substrate layer.

10. The ESD protection device of claim 9, wherein the third terminal region is arranged over the side surface of the second border region of the first substrate layer.

11. The ESD protection device of claim 1, wherein a portion of the middle region of the second substrate layer is arranged laterally between the first bridged region and the second bridged region.

12. The ESD protection device of claim 1, further comprising an isolation element arranged laterally between the first bridged region and the second bridged region.

13. The ESD protection device of claim 1, wherein the substrate further comprises a third substrate layer arranged under the first substrate layer, wherein the entire third substrate layer has the second conductivity type and is laterally wider than the middle region of the first substrate layer.

14. The ESD protection device of claim 13, wherein each of the border regions of the first substrate layer is arranged entirely over the third substrate layer.

15. The ESD protection device of claim 1, wherein the middle region of the first substrate layer comprises a part of a first high voltage well.

16. The ESD protection device of claim 15, wherein the first border region of the first substrate layer comprises a part of a second high voltage well and the second border region of the first substrate layer comprises a part of a third high voltage well.

17. The ESD protection device of claim 16, wherein the first high voltage well extends laterally beyond the second high voltage well and the third high voltage well.

18. A method for fabricating an electrostatic discharge (ESD) protection device, the method comprising:

providing a substrate;

forming a first substrate layer and a second substrate layer over the first substrate layer, wherein each substrate layer comprises a first border region, a second border region being continuous and a middle region extending continuously and laterally from the first border region to the second border region; and forming a first bridged region and a second bridged region, wherein each bridged region is continuous and arranged within the middle region and a respective border region of the second substrate layer;

wherein the middle region of the second substrate layer is laterally narrower than the middle region of the first substrate layer, wherein a width of the middle region of the second substrate layer ranges from about 30% to about 70% of a width of the middle region of the first substrate layer;

wherein each border region of the second substrate layer is arranged over and partially overlapping the middle region of the first substrate layer and arranged over and overlapping a respective border region of the first substrate layer; and wherein the first and second border regions of the first and second substrate layers and the first and second bridged regions have a first conductivity type, and wherein the middle regions of the first and second substrate layers have a second conductivity type different from the first conductivity type, wherein the first and second border regions of each substrate layer include a continuous region of the first conductivity type laterally extending between opposite border edges.

19. The ESD protection device of claim 4, wherein the first terminal region and the second terminal region are electrically connected to a same conductive line.

* * * * *